US008846190B2

(12) United States Patent
Belcher et al.

(10) Patent No.: US 8,846,190 B2
(45) Date of Patent: *Sep. 30, 2014

(54) INORGANIC NANOWIRES (71) Applicants: Board of Regents, The University of Texas System, Austin, TX (US); Massachusetts Institute of Technology, Cambridge, MA (US)

(72) Inventors: Angela M. Belcher, Lexington, MA (US); Chuanbin Mao, Austin, TX (US); Daniel J. Solis, Austin, TX (US)

(73) Assignees: The Board of Regents, The University of Texas System, Austin, TX (US); Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/010,962

(22) Filed: Aug. 27, 2013

(65) Prior Publication Data
US 2014/0212664 A1 Jul. 31, 2014

Related U.S. Application Data (63) Continuation of application No. 13/525,637, filed on Jun. 18, 2012, now Pat. No. 8,523,044, which is a continuation of application No. 13/041,236, filed on Mar. 4, 2011, now Pat. No. 8,201,724, which is a continuation of application No. 10/976,179, filed on Oct. 29, 2004, now Pat. No. 7,923,109.

(60) Provisional application No. 60/534,102, filed on Jan. 5, 2004.

(51) Int. Cl.
*D02G 3/00* (2006.01)
*H01B 1/10* (2006.01)

(52) U.S. Cl.
CPC ..... *H01B 1/10* (2013.01); *H01B 1/01* (2013.01)
USPC .................. 428/292.1; 428/364; 428/401

(58) Field of Classification Search
None
See application file for complete search history.

(56) References Cited

U.S. PATENT DOCUMENTS

| 5,223,409 A | 6/1993 | Ladner et al. |
| 5,403,484 A | 4/1995 | Ladner et al. |
| 5,571,698 A | 11/1996 | Ladner et al. |
| 5,766,905 A | 6/1998 | Studier et al. |
| 5,885,808 A | 3/1999 | Spooner et al. |
| 5,897,945 A | 4/1999 | Lieber et al. |

(Continued)

FOREIGN PATENT DOCUMENTS

| WO | WO 02/093140 A1 | 11/2002 |
| WO | WO 03/078451 A2 | 9/2003 |

OTHER PUBLICATIONS

Alivisatos et al., "Organization of 'nanocrystal molecules' using DNA," Nature, Aug. 15, 1996, 382:609-611.

(Continued)

*Primary Examiner* — Kelly Stoner
(74) *Attorney, Agent, or Firm* — Foley & Lardner LLP (57) ABSTRACT

Provided in one embodiment is a method of forming an inorganic nanowire, comprising: providing an elongated organic scaffold; providing a plurality of inorganic nanoparticles attached to the organic scaffold along a length of the organic scaffold; and fusing the nanoparticles attached to the organic scaffold to form an inorganic nanowire.

9 Claims, 3 Drawing Sheets

(56) References Cited

U.S. PATENT DOCUMENTS

| | | | |
|---|---|---|---|
| 5,997,832 | A | 12/1999 | Lieber et al. |
| 6,036,774 | A | 3/2000 | Lieber et al. |
| 6,159,742 | A | 12/2000 | Lieber et al. |
| 6,190,634 | B1 | 2/2001 | Lieber et al. |
| 6,225,198 | B1 | 5/2001 | Alivisatos et al. |
| 6,261,554 | B1 | 7/2001 | Valerio et al. |
| 6,946,410 | B2 | 9/2005 | French et al. |
| 7,160,525 | B1 * | 1/2007 | Peng et al. ............... 423/1 |
| 7,332,321 | B2 | 2/2008 | Belcher et al. |
| 7,374,893 | B2 | 5/2008 | Belcher et al. |
| 7,452,679 | B2 | 11/2008 | Stupp et al. |
| 7,488,593 | B2 | 2/2009 | Belcher et al. |
| 7,551,141 | B1 * | 6/2009 | Hadley et al. ......... 343/700 MS |
| 7,598,344 | B2 | 10/2009 | Belcher et al. |
| 2001/0019820 | A1 | 9/2001 | Li |
| 2002/0055239 | A1 | 5/2002 | Tuominen et al. |
| 2002/0117659 | A1 | 8/2002 | Lieber et al. |
| 2002/0130353 | A1 | 9/2002 | Lieber et al. |
| 2003/0044901 | A1 | 3/2003 | Coleman et al. |
| 2003/0068900 | A1 | 4/2003 | Belcher et al. |
| 2003/0073104 | A1 | 4/2003 | Belcher et al. |
| 2003/0077625 | A1 | 4/2003 | Hutchison |
| 2003/0089899 | A1 | 5/2003 | Lieber et al. |
| 2003/0113714 | A1 | 6/2003 | Belcher et al. |
| 2003/0148380 | A1 | 8/2003 | Belcher |
| 2003/0175290 | A1 | 9/2003 | Renner et al. |
| 2003/0200521 | A1 | 10/2003 | DeHon et al. |
| 2004/0058457 | A1 | 3/2004 | Huang et al. |
| 2004/0059094 | A1 | 3/2004 | Bachmann et al. |
| 2004/0136962 | A1 | 7/2004 | Renner et al. |
| 2004/0171139 | A1 | 9/2004 | Belcher et al. |
| 2004/0206942 | A1 * | 10/2004 | Hsu ............................. 252/500 |
| 2004/0254297 | A1 * | 12/2004 | Hsu et al. .................. 525/54.2 |
| 2005/0064508 | A1 | 3/2005 | Belcher et al. |
| 2005/0074911 | A1 * | 4/2005 | Kornilovich et al. .......... 438/20 |
| 2005/0148028 | A1 | 7/2005 | Coleman et al. |
| 2005/0164515 | A9 | 7/2005 | Belcher et al. |
| 2005/0170336 | A1 | 8/2005 | Belcher et al. |
| 2005/0209145 | A1 | 9/2005 | Stupp et al. |
| 2006/0052947 | A1 | 3/2006 | Hu |
| 2006/0160276 | A1 * | 7/2006 | Brown et al. ................ 438/149 |
| 2006/0275791 | A1 | 12/2006 | Belcher et al. |
| 2007/0020773 | A1 * | 1/2007 | Kornilovich et al. ............ 438/2 |
| 2007/0087409 | A1 | 4/2007 | Bachmann |
| 2008/0105855 | A1 * | 5/2008 | Buretea et al. ............... 252/582 |
| 2009/0269619 | A1 | 10/2009 | Belcher et al. |
| 2011/0097556 | A1 | 4/2011 | Belcher et al. |
| 2011/0300400 | A1 | 12/2011 | Tomita et al. |
| 2012/0264166 | A1 | 10/2012 | Belcher et al. |
| 2012/0264912 | A1 | 10/2012 | Stupp et al. |

OTHER PUBLICATIONS

Alivisatos, "Naturally Aligned Nanocrystals," Science, Aug. 4, 2000, 298:736-737, University of California, Berkeley, CA, USA.

An et al., "Supercapacitors using single-walled carbon nanotube electrodes," Advanced Materials, 2001, 13(7):497-500.

Banfield et al., "Aggregation-Based Crystal Growth and Microstructure Development in Natural Iron Oxyhydroxide Biomineralization Products," Science, Aug. 4, 2000, 289:751-754, Johns Hopkins University, Baltimore, MD, USA.

Barbas et al., "A Laboratory Manual," Phage Display, 2001, Cold Spring Harbor Laboratory Press, Cold Spring Harbor, NY, USA, Table of Contents, 5 pages.

Barmak et al., "Calorimetric Studies of the A1 to $L1_0$ Transformation in FePt and CoPt Thin Films," Appl. Phys. Lett., Jun. 3, 2002, pp. 4268-4270, vol. 80, No. 22, USA.

Bonard et al., "Degradation and failure of carbon nanotube field emitters," Physical Review B: Condensed Matter and Materials Physics, 2003, 67(11): 115406-115406.

Cha et al., "Biomimetic Synthesis of Ordered Silica Structures Mediated by Block Copolypeptides," Nature, Jan. 20, 2000, pp. 289-292, vol. 403, University of California, Santa Barbara, California, USA.

Chang et al., "Low-temperature catalytic growth of β-Ga2O3 nanowires using single organometallic precursor," J. Phys. Chem. B, 2004, 108:1838-1843.

Choi et al., "Bimetallic Pt-Ru nanowire network for anode material in a direct-methanol fuel cell," J. Power Sources, 2003, 124:420-425.

Ciu et al., "Nanowire Nanosensors for Highly Sensitive and Selective Detection of Biological and Chemical Species," Science, Aug. 17, 2001, 293:1289-1292.

De Heer et al., "A Carbon Nanotube Field-Emission Electron Source", Science, Nov. 17, 1995, 1270:1179-1180.

Dominko et al., "Dichalcogenide Nanotube Electrodes for Li-Ion Batteris", Advanced Materials, Nov. 4, 2002, 14(21):1531-1534.

Douglas et al., "Host-Guest Encapsulation of Materials by Assembled Virus Protein Cages," Nature, May 14, 1998, 393:152-155.

Duan et al., "General Synthesis of Compound Semiconductor Nanowires", Advanced Materials, 2000, 12(4): 298-302, Harvard University, Cambridge, MA, USA.

Dujardin et al., "Organization of Metallic Nanoparticles Using Tobacco Mosaic Virus Templates," 2003, 3(3): 413-417.

Fairley, Peter, "Germs That Build Circuits,": IEEE Spectrum, 2003, 37-41.

Flynn et al., "Synthesis and Organization of Nanoscale II-VI Semiconductor Materials Using Evolved Peptide Specificity and Viral Capsid Assembly," J. Mater. Chem., 2003, pp. 2414-2421, vol. 13, USA.

Flynn et al., "Viruses as vehicles for growth, organization and assembly of materials," Acta Materialia, 2003, 51:5887-5880.

Gao et al., "A method for the generation of combinatorial antibody libraries using pIX phage display," PNAS, Oct. 1, 2002, 99(20):12612-12616.

Gao et al., "Making Artificial Antibodies: A Format for Phage Display of Combinatorial Heterodimeric Arrays," Proc. Natl. Acad. Sci., May 1999, 96:6025-6030, USA.

Greenwood et al., "Regulation of filamentous bacteriophage length by modification of electrostatic interactions between coat protein and DNA," Journal of Molecular Biology, 1991, 217:223-227.

Gudiksen et al., "Growth of nanowire superlattice structures for nanoscale photonics and electronics," Nature, Feb. 7, 2002, 415:617-620.

Hartgerink et al., "Self-Assembly and Mineralization of Peptide-Amphiphile Nanofibers," Science, Nov. 23, 2001, 294:1684-1688, Northwestern University, Evanston, IL, USA.

Hu et al., "Linearly polarized emission from colloidal semiconductor quantum roads," Science, Jun. 15, 2001, 292:2060-2063.

Huang et al., "CoPt and FePt Nanowires by Electrodeposition," Journal of Applied Physics, May 15, 2002, 91(10):6869-6871, University of Delaware, Newark, Delaware, USA.

Huang et al., "Logic Gates and Computation from Assembled Nanowire Building Blocks," Science, Nov. 9, 2001, 294:1313-1317, Harvard University, Cambridge, MA, USA.

Keren et al., "DNA-templated carbon nanotube field-effect transistor," Science, Nov. 21, 2003, 302:1380-1382.

Kuykendall et al., "Crystallographic alignment of high-density gallium nitride nanowire arrays," Aug. 2004, Nature Materials 3: 524-528.

Kuykendall et al., "Metalorganic chemical vapor deposition route to GaN Nanowires with triangular cross sections," NanoLetters, 2003, 3(8):1063-1066.

Lee et al., "Ordering of Quantum Dots Using Genetically Engineered Viruses," Science, May 3, 2002, 296:892-895, USA.

Lewenstein et al., "High-yield selective placement of carbon nanotubes on pre-pattrned electrodes," NanoLetters, 2002, 2(5):443-446.

Lieber, Charles M., "The Incredible Shrinking Circuit," Understanding Nanotechnology, 2002, 92-103.

Luedtke et al., "Structure, Dynamics, and Thermodynamics of Passivated Gold Nanocrystallites and Their Assemblies," J. Phys. Chem., Aug. 8, 1996, 100(32): 13323-13329, Georgia Institute of Technology, Atlanta, GA, USA.

Malik et al., "Simultaneous Display of Different Peptides on the Surface of Filamentous Bacteriophage," Nucleic Acids Research, 1997, 25(4): 915-916.

(56) References Cited

OTHER PUBLICATIONS

Manna et al., "Synthesis of Soluble and Processable Rod-, Arrow-, Teardrop-, and Tetrapod-Shaped CdSe Nanocrystals," J. Am. Chem. Soc., 2000, 122:12700-12706, University of California, Berkeley, California, USA.

Mao et al., "Viral assembly of oriented quantum dot nanowires," PNAS, Jun. 10, 2003, 100(12):6946-6951.

Mao et al., "Virus-based toolkit for the directed synthesis of magnetic and semiconducting nanowires," Science, 2004, 303:213-217.

Morales et al., "A laser ablation method for the synthesis of crystalline semiconductor nanowires," Science, Jan. 9, 1998, 279:208-211.

Murakami et al., "Field emission from well-aligned, patterned, carbon nanotube emitters," Applied Physics Letters, 2000, 76(13):1776-1778.

Nam et al., "Genetically driven assembly of nanorings based on the M13 virus," NanoLetters, 2004, 4(1):23-27.

Ng et al., "Single crystal nanowire vertical surround-gate field-effect transistor," NanoLetters, 2004, 4(7):1247-1252.

Oh et al., "Room-temperature fabrication of high-resolution carbon nanotube field-emission cathods by self-aseembly," Applied Physics Letters, 2003, 82(15):2521-2523.

Penn et al., "Morphology Develoopment and Crystal Growth in Nanocrystalline Aggregates Under Hydrothermal Conditions: Insights from Titania," Geochimicia et Cosmochimica Acta., 1999, 63(10:1549-1557, University of Wisconsin, Madison, Wisconsin, USA, Picclotto et al., "Four-Terminal Resistance of a Ballistic Quantum Wire," Nature, May 3, 2001, 411:51-54, USA.

Poole et al., "Nanostructured Ferromagnetism," Introduction o Nanotechnology, 2003, Chapter 7, 165-193.

Qadri et al., "Size-Induced Transition-Temperature Reduction in Nanoparticles of ZnS," Physical Review B, The American Physical Society, Oct. 1, 1999, 60(13):9191-9193, USA.

Rao et al., "Nanocrystals of metals, semiconductors and oxides: Novel synthesis and applications," Current Science, 2003, 85(7):1041-1045.

Reches et al., "Casting Metal Nanowires Within Discrete Self-Assembled Peptide Nanotubes," Science, Apr. 25, 2003, 300:625-627, Tel Aviv, Israel.

Reiss et al., "Biological Routes to Metal Alloy Ferromagnetic Nanostructures," Nano Letters, 2004, 4(6):1127-1132, USA.

Ring, Christopher (Ed.), "2.3 Filamentous bacteriophage vectors," Genetically Engineered Viruses, Bios Scientific, 2001, 11-21.

Savchuk et al., "Technological aspects of fabrication of semimagnetic semiconductor nanocrystals," Materials Science and Engineering, 2001, 15(1-2):79-81.

Spindt et al,, "Physical properties of thin-film field emission cathodes with molybdenum cones," Journal of Applied Physics, 1976, 47(12):5248-5263.

Sun et al., "Monodisperse FePt Nanoparticles and Ferromagnetic FePt Nanocrystal Superlattices," Science, Mar. 17, 2000, 287:1989-1992, USA.

Supplementary European Search Report dated Feb. 11, 2010 in counterpart EP 05726223.0, 3 pages.

Tang et al., "Electronic structures of single-walled carbon nanotubes determined by NMR," Science, Apr. 21, 2000, 288:492-494.

Wang et al., "Catalytic Growth and Photoluminescence Properties of Semiconductor Single-Crystal Zns Nanowires," Chemical Physics Letters, May 10, 2002, 357:314-318, China.

Whaley et al., "Selection of Peptides with Semiconductor Binding Specificity for Directed Nanocrystal Assembly," Nature, Jun. 8, 2000, 405:665-668, USA.

Williams et al., "Carbon nanotubes with DNA recognition," Nature, 2002, 420:761.

Xia et al., One-Dimensional Nanostructures: Synthesis, Characterization, and Applications, Advanced Materials, 2003, 15(5):353-389.

Ye et al., "On the Growth of CdS Nanowrites by the Evaporation of CdS Nanopowders," J. Phys Chem., 2002, 106:10338-10341, China.

Yeadon et al., "Contact Epitaxy Observed in Supported Nanoparticles," Applied Physics Letters, Nov. 30, 1998, 73(22):3208-3210, University of Illinois, Urbana, IL, USA.

Zhu et al., "Sintering processes of two nanoparticles: a study by molecular-dynamics simulations," Philo. Mag. Lett., 1996, 73(1):27-33.

* cited by examiner

Figure 3

INORGANIC NANOWIRES

This application is a Continuation of U.S. application Ser. No. 13/525,637, filed Jun. 18, 2012, now U.S. Pat. No. 8,523,044, which is a Continuation of U.S. application Ser. No. 13/041,236, filed Mar. 4, 2011, now U.S. Pat. No. 8,201,724, which is a Continuation of U.S. application Ser. No. 10/976,179, filed Oct. 29, 2004, now U.S. Pat. No. 7,923,109, which claims benefit under 35 U.S.C. 119(e) to U.S. Provisional Application No. 60/534,102, filed Jan. 5, 2004, all of which are hereby incorporated by reference in their entirety.

This invention was made with government support awarded by the Army Research Office under Grant Number DAAD19-03-1-0088. The government has certain rights in the invention.

INTRODUCTION

The reliance of a wide variety of technologies on developing scalable and economic methods for the fabrication of one-dimensional materials, including nanowires and nanotubes, has spurred intense and rapid progress in the area of materials synthesis. For example, one-dimensional materials have been enthusiastically pursued for their applications in the study of, for example, electrical transport (1), optical phenomena (2), and as functional units in nanocircuitry (3). Pursuit of "bottom up" methods for the synthesis of semiconducting, metallic and magnetic nanowires has yielded a variety of synthetic strategies including, but not limited to, Vapor Liquid Solid (VLS) (4), chemical (5), solvothermal, vapor phase, and template-directed fabrication (6). Although each method developed for the production of nanowires has had some basic success in achieving high quality materials, methods to date have not yielded monodisperse, crystalline nanowires of radically different compositions. In general, prior methods for nanowire production can be erratic, synthetically cumbersome, and are not universal. See, for example, U.S. Pat. No. 6,225,198 to Alivisatos et al. for II-VI semiconductor production in liquid media and references cited herein. Reference 4 to Lieber et al. describes the difficulty in finding a universal approach. It describes a VLS process that requires use of lasers and high temperatures and produces a nanowire having a nanoparticle at the end which may not be desirable.

Recently, biological factors have been exploited as synthesis directors for nanofibers (7, 8), virus-based particle cages (9), virus-particle assemblies (10, 11, 12), and non-specific peptide templates (13). This is due to the high degree of organization, ease of chemical modification and naturally occurring self-assembly motifs in these systems.

Belcher et al. have prepared nanowires associated with and bound to genetically engineered viral scaffolds (see, for example, U.S. Patent Publication, 2003/0068900 to Belcher et al.). The scaffolds serve as a template as nanoparticles or nanocrystals form on the scaffold. Although this technology is attractive and provides important advantages, a need exists to improve upon it. For example, it is desirable to generate improved properties such as improved fusion between the nanocrystals and reduction in defects. It is also desirable to fuse the nanocrystals into one long single crystal rod or into large crystalline domains. Moreover, it is desirable in many applications to not have and substantially eliminate the viral scaffold bound to or associated with the viral scaffold. Moreover, it is desirable to control the size and size statistical distributions for the nanowires including, for example, prepare monodisperse materials and materials having controlled length. If possible, the nanowires should be usable directly, without need for a size-based separation step before use. A need also exists to be able to connect the nanowires with other components such as electrodes which allow the nanowires to be commercially useful. These connections should, if possible, not be mere chance connections but be strategically directed and controllable.

References numerically cited in this specification are provided in a listing at the end of the specification and are incorporated by reference in the specification in their entirety.

SUMMARY

The present invention in many of its embodiments is summarized in this non-limiting summary section.

In one embodiment, the present invention provides an inorganic nanowire having an organic scaffold substantially removed from the inorganic nanowire, the inorganic nanowire consisting essentially of fused inorganic nanoparticles substantially free of the organic scaffold ("the inorganic nanowire of embodiment 1").

The present invention also provides compositions and devices comprising a plurality of these inorganic nanowires. In another embodiment, the present invention provides a composition comprising a plurality of inorganic nanowires, wherein the inorganic nanowires comprise fused inorganic nanoparticles substantially free of organic scaffold.

In another embodiment, the present invention provides a method of forming an inorganic nanowire comprising the steps of: (1) providing one or more precursor materials for the inorganic nanowire; (2) providing an elongated organic scaffold; (3) reacting the one or more precursor materials in the presence of the scaffold to form nanoparticles, wherein the nanoparticles are disposed along the length of the elongated organic scaffold; and (4) thermally treating the scaffold and the nanoparticles to form the inorganic nanowire by fusion of the nanoparticles. In some embodiments, the organic scaffold can be removed, such as during the thermal treatment. The present invention also provides nanowires prepared by this method.

Also provided is a method of forming an inorganic nanowire comprising the steps of: (1) providing one or more precursor materials for the inorganic nanowire; (2) providing an organic scaffold; (3) reacting the one or more precursor materials in the presence of the scaffold under conditions to form the inorganic nanowire. In some embodiments, the organic scaffold can be removed, such as during the reacting. The present invention also provides nanowires prepared by this method.

The present invention also provides for use of a filamentous organic scaffold as a sacrificial organic scaffold in the production of an inorganic nanowire comprising providing a filamentous organic scaffold and an inorganic nanowire precursor on the scaffold, converting the inorganic nanowire precursor to the inorganic nanowire while removing the filamentous organic scaffold to yield the inorganic nanowire.

An additional use provided herein is the use of an elongated organic scaffold to control the length of an inorganic nanowire disposed thereon, comprising the step of genetically engineering the scaffold to control the length of the scaffold.

An important embodiment is also a device comprising an electrode in electrical contact with the inorganic nanowire of embodiment 1 or any other nanowire described herein. In another embodiment, the device can further comprise at least two electrodes each in electrical contact with the inorganic nanowire of embodiment 1 or any other nanowire described herein. Examples of devices include a field effect transistor or a sensor. In other embodiments, the device comprises at least two nanowires according to embodiment 1, or any other nanowires described herein, wherein the nanowires are in a parallel arrangement, or in a crossed arrangement.

The invention also provides a segmented nanowire comprising a plurality of connected segments of inorganic nanowires of embodiment 1 or any other nanowires described herein. In some embodiments, the scaffold was used to form the nanowire and/or direct the placement of the nanowire before being removed.

The invention also provides a composition comprising a plurality of inorganic nanowires, wherein the inorganic nanowires comprise fused inorganic nanoparticles that were disposed on an organic scaffold. In some embodiments, the scaffold(s) were used to form the nanowires and/or direct the placement of the nanowires, such as placement in a circuit substrate, before being removed.

The invention also provides a process for producing nanowires with use of an elongated organic scaffold comprising the steps of: (1) providing an elongated organic scaffold which comprises a plurality of binding sites including binding sites along the length of the scaffold and binding sites on at least one end of the scaffold; (2) disposing a nanowire precursor composition along the length of the scaffold to form a scaffolded precursor composition; and (3) treating the scaffolded precursor composition to form the nanowire. In some embodiments, the scaffold is substantially removed, such as during the treating step. In one embodiment, the elongated organic scaffold has binding sites at both ends of the scaffold. In another embodiment, the process further comprises the step of using the binding site at the end of the scaffold to bind to another structure. For example, the another structure can be another elongated organic scaffold.

The invention also provides compositions. For example, in one embodiment, a nanowire composition is provided comprising a nanowire with a thermodynamically high energy phase, or a collection of nanowires according to this embodiment, wherein the nanowires are substantially monodisperse in length, width, or length and width. In this embodiment, the nanowire can be an inorganic nanowire such as, for example, a nanowire of semiconductive material, metallic material, metal oxide material, magnetic material, or mixtures thereof.

The invention also provides an inorganic nanowire comprising fused inorganic nanoparticles, or a composition comprising a collection of inorganic nanowires according to this embodiment. In this embodiment, the invention also provides an inorganic nanowire comprising fused inorganic nanoparticles comprising semiconductor material, metallic material, metal oxide material, or magnetic material, as well as collections of these nanowires.

The invention also provides an inorganic nanowire consisting essentially of fused inorganic nanoparticles that were disposed on an organic scaffold.

A basic and novel feature for many embodiments of the present invention is the substantial elimination of the organic scaffold when it is used to prepare the nanowire. In many embodiments, its preferred that the organic scaffold be totally eliminated. Moreover, a basic and novel advantage in many embodiments is that the nanowires can be fabricated directly with good monodispersity without use of a size-based separation of some nanowires from other nanowires.

DETAILED DESCRIPTION

I. Introduction

The present invention provides, in one embodiment, an inorganic nanowire having an organic scaffold substantially removed from the inorganic nanowire, the inorganic nanowire consisting essentially of fused inorganic nanoparticles substantially free of the organic scaffold. The present invention also provides compositions comprising a plurality of these inorganic nanowires. This invention also provides compositions comprising a plurality of inorganic nanowires, wherein the inorganic nanowires comprise fused inorganic nanoparticles substantially free of organic scaffold.

The organic scaffold is generally removed so that, preferably, it cannot be detected on the nanowire. This substantial removal can be described in terms of weight percentage remaining. For example, the amount of remaining organic scaffold with respect to the total amount of nanowire and scaffold can be less than 1 wt. %, more preferably, less than 0.5 wt. %, and more preferably, less than 0.1 wt. %. A basic and novel feature of the invention is the substantial removal of the scaffold in the production of high quality nanowires.

In another patent application, which is hereby incorporated by reference in its entirety, [U.S. Ser. No. 10/665,721 filed Sep. 22, 2003 to Belcher et al. ("Peptide Mediated Synthesis of Metallic and Magnetic Materials")], additional description is provided for burning off and elimination of a viral scaffold from materials to which the scaffold can selectively bind. In this application, annealing temperatures of 500-1,000° C. are described for burning off the scaffold. In addition, Mao et al., Virus-based toolkit for the directed synthesis of magnetic and semiconducting nanowires, *Science* 303:213-217 (2004), which is hereby incorporated by reference including all figures and the experimental section, includes some teachings that may be useful in practicing the present invention. Fairley, Peter, (2003) Germs That Build Circuits, *IEEE Spectrum* 37-41, which is hereby incorporated by reference in its entirety including all figures and use of electrodes connected by nanowires, also includes teachings that may be useful in practicing the present invention, such as applications of nanowires. Priority provisional application No. 60/534,102 filed Jan. 5, 2004 by Belcher et al., is hereby incorporated by reference in its entirety.

The detailed description of the invention is organized according to the following sections: (1) introduction, (2) scaffold which is substantially removed, (3) nanowires, (4) methods of making nanowires, (5) applications for the nanowires, and (6) working examples.

II. Scaffold

Although the scaffold ultimately may be substantially removed from the nanowire, the scaffold is an important part of the invention. In the practice of the present invention, one skilled in the art can refer to technical literature for guidance on how to design and synthesize the scaffold including the literature cited herein and listed at the conclusion of the specification. For example, although the present invention relates to organic scaffolds and is not limited only to viral scaffolds in its broadest scope, viral scaffolds are a preferred embodiment. In particular, an elongated organic scaffold can be used which is a virus, and the term virus can include both a full virus and a virus subunit such as a capsid. The literature describes the preparation of viral scaffolds through genetic engineering with recognition properties for exploitation in materials synthesis. This includes use of viruses in the production of inorganic materials which have technologically useful properties and nanoscopic dimensions. In the present invention, one skilled in the art can use the literature in the practice of the present invention to prepare inorganic nanowires on scaffolds, wherein the scaffolds are later substantially eliminated so that the inorganic nanowire is substantially free of the scaffold. When the scaffold is intended to be removed, the scaffold may be referred to as a "sacrificial scaffold."

One skilled in the art, for example, can refer to the following patent literature for selection of the virus, genetic engineering methods, and for materials to be used with genetically engineered viruses. Phage display libraries and experimental methods for using them in biopanning are further described, for example, in the following U.S. patent publications to Belcher et al.: (1) "Biological Control of Nanoparticle Nucleation, Shape, and Crystal Phase"; 2003/0068900 published Apr. 10, 2003; (2) "Nanoscale Ordering of Hybrid Materials Using Genetically Engineered Mesoscale Virus"; 2003/0073104 published Apr. 17, 2003; (3) "Biological Control of Nanoparticles"; 2003/0113714 published Jun. 19, 2003; and (4) "Molecular Recognition of Materials"; 2003/0148380 published Aug. 7, 2003, which are each hereby incorporated by reference in their entirety. Additional patent applications useful for one skilled in the art describe viral and peptide recognition studies with use of genetically engineered viruses for materials synthesis and applications including, for example, (1) U.S. Ser. No. 10/654,623 filed Sep. 4, 2003 to Belcher et al. ("Compositions, Methods, and Use of Bi-Functional BioMaterials"), (2) U.S. Ser. No. 10/665,721 filed Sep. 22, 2003 to Belcher et al. ("Peptide Mediated Synthesis of Metallic and Magnetic Materials"), and (3) U.S. Ser. No. 10/668,600 filed Sep. 24, 2003 to Belcher et al. ("Fabricated BioFilm Storage Device"), (4) U.S. provisional Ser. No. 60/510,862 filed Oct. 15, 2003 and the U.S. utility application Ser. No. 10/965,665 filed Oct. 15, 2004 to Belcher et al. ("Viral Fibers"); and (5) U.S. provisional Ser No. 60/511,102 filed Oct. 15, 2003 and the U.S. utility application Ser. No. 10/965,227 filed Oct. 15, 2004 to Belcher et al. (Multifunctional Biomaterials . . . "); each of which are hereby incorporated by reference. These references describe a variety of specific binding modifications which can be carried out for binding to conjugate structures, as well as forming the conjugate structures in the presence of the material modified for specific binding. In particular, polypeptide and amino acid oligomeric sequences can be expressed on the surfaces of viral particles, including both at the ends and along the length of the elongated virus particle such as M13 bacteriophage, including pIII and pVIII expressions, as well as pIX, pVII, and pVI expressions, and combinations thereof. Using these expression sights, the viruses may be engineered to express surface peptides along the length of the virus, at the ends of the virus, or any number of other sites and combinations of sites. A single site for modification can be modified with more than one unit for specific binding. For example, a pVIII site can be modified to have two distinctly different binding units. In addition, different sites for modification can be modified with the same or different units for binding. For example, the ends of the virus particles can be modified to bind to specifically bind a first material, while the body of the virus particles can be modified to bind a second material. Multiple binding sites can be used to create multifunctional scaffolds that can be used to form nanowires with specifically engineered and varying compositions among other applications. The binding sites can be designed so that nanoparticles nucleate at the binding sites or the binding sites can be designed to bind preformed nanoparticles. The scaffold can be functionalized with sufficient binding units to achieve the desired concentration needed to form the nanowire.

In addition, the paper "Selection of Peptides with Semiconductor Binding Specificity for Directed Nanocrystal Assembly"; Whaley et al., Nature, Vol. 405, Jun. 8, 2000, pages 665-668, herein incorporated by reference, describes a method of selecting peptides with binding specificity using a combinatorial library. Specifically, the article shows a method of selecting peptides with binding specificity to semiconductor materials using a combinatorial library with about $10^9$ different peptides. The combinatorial library of random peptides, each containing 12 amino acids, were fused to the pIII coat protein of M13 coliphage and exposed to crystalline semiconductor structures. Peptides that bound to the semiconductor materials were eluted, amplified, and re-exposed to the semiconductor materials under more stringent conditions. After the fifth round of selection, the semiconductor specific phages were isolated and sequenced to determine the binding peptide. In this manner, peptides were selected with high binding specificity depending on the crystallographic structure and composition of the semiconductor material. The technique can be modified to obtain peptides with a binding specificity for not just semiconductor materials, but a range of both organic and inorganic materials.

Figure 1:
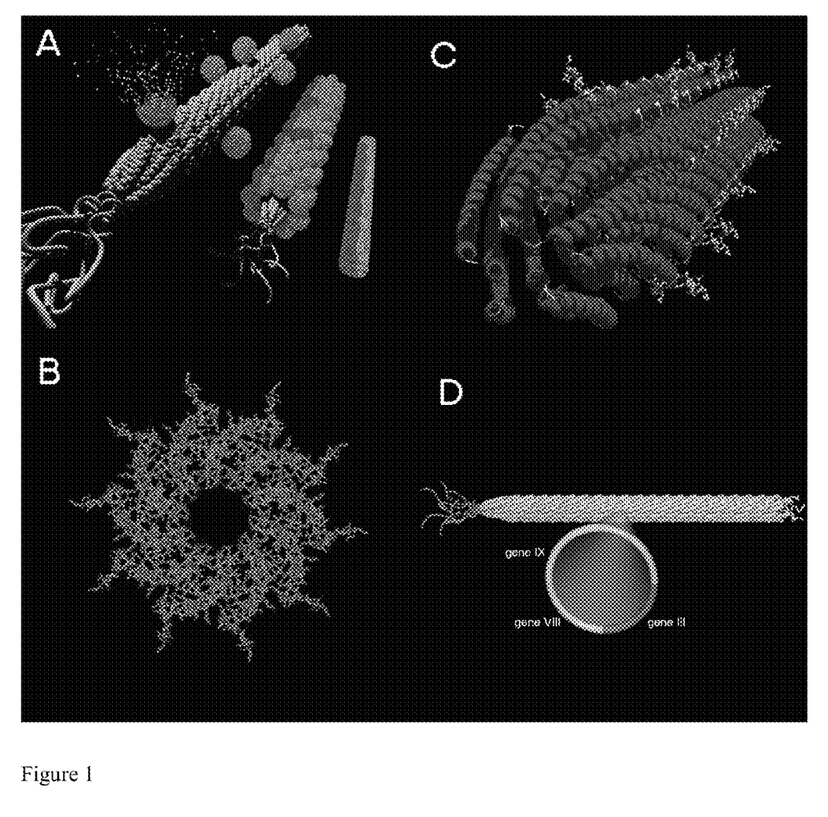
FIGS. 1A-D illustrate viruses which can be used as scaffolds.

One skilled in the art can also refer to, for example, C. E. Flynn et al. Acta Materialia, vol 13, 2413-2421 (2003) entitled "Viruses as vehicles for growth, organization, and assembly of materials." This reference, as well as all references cited therein, are incorporated herein by reference in their entirety. In addition, reference 12 below (Mao et al., PNAS) is hereby incorporated by reference for all of its teachings including the nucleation and structures shown in FIG. 1. Also, in particular, reference 17 (Flynn et al., J. Mater. Chem) is also incorporated by reference in its entirety including descriptions of using aqueous salt compositions to nucleate nanocrystals which are directed in their crystal structure and orientation by the recognition sites. In the present invention, these nucleated nanocrystals can be converted to single crystalline and polycrystalline nanowires, wherein the scaffold is substantially removed.

The scaffold is further described including the role of genetic programming for the preferred embodiments. Although the viral scaffolds represent a preferred embodiment, the present invention comprises other types of non-viral scaffolds as well. Also, although M13 virus is a preferred embodiment for a scaffold, the present invention is not limited to this virus.

The scaffold can comprise an entire virus, a virion, or viral subunits including capsids. Viral subunits including proteins, peptides, nucleic acids, DNA, RNA, and the like, in various combinations. The scaffold does not require that both peptide and nucleic acid be present. For example, virus mimics can be used or engineered, wherein the size, shape, or structure mimics that of a virus, but the does not contain nucleic acid and/or may not have the ability to infect a host for replication. One skilled in the art can prepare viral scaffolds based on purely synthetic methods from the bottom up as well as using more traditional methods wherein materials are supplied by nature without or without modification by man.

In a preferred embodiment, wherein the scaffold is a virus or a virus subunit, the scaffold is tailored and designed in structure and function by genetic programming and/or genetic engineering for production of the one dimensional materials such as nanowires. The genetic programming can be used to tailor the scaffold for the particular application, and applications are described further below. The references in Section I describe genetic programming which is further described in this section for use in practice of the present invention. See, e.g., *Genetically Engineered Viruses*, Christopher Ring and E. D. Blair (Eds.), Bios Scientific, 2001, for descriptions of developments and applications in use of viruses as vehicles and expressors of genetic material including, for example, prokaryotic viruses, insect viruses, plant viruses, animal DNA viruses, and animal RNA viruses. In the present invention, genetic programming can be carried out to engineer a scaffold using the different displayed peptide features of a virus such as, for example, a filamentous bacteriophage such as, for example, the M13 virus which has a rod shape. Genetic programming can be used to control the scaffold for materials synthesis, the viral scaffold comprising one or more viral particle subunits which may or may not include the nucleic acid subunit of the virus. Also, the scaffold may or may not retain infectability.

An overall commercial advantage to this genetic programming approach to materials engineering, in addition to materials-specific addressability, is the potential to specify viral length and geometry. For example, an elongated organic scaffold may be genetically engineered to control the length of the scaffold. This engineering of length can allow the design of nanowires of specific, controlled lengths, for example. Hence, a variety of methods can be used to control the scaffold length and geometry.

For example, the length of a filamentous virus is generally related to the size of its packaged genetic information and the electrostatic balance between the pVIII-derived core of the virion and the DNA. See, e.g., B. K. Kay, J. Winter, J. McCafferty, Phage Display of Peptides and Proteins: A Laboratory Manual, Academic Press, San Diego, 1996; Greenwood et al., *Journal of Molecular Biology* 217:223-227 (1992). Phage observed by AFM generally are seen to be roughly 860 nm and as short as 560 nm depending on whether the complete M13 genome or smaller phagemid are used in sample preparation. See, e.g., reference 12, C. Mao, C. E. Flynn, A. Hayhurst, R. Sweeney, J. Qi, J. Williams, G. Georgiou, B. Iverson, A. M. Belcher, Proc. Natl. Acad. Sci. 2003, 100, 6946. Also, changing a single lysine to glutamine on the inner-end of pVIII can result in particles approximately 35% longer than wild type phage. See, e.g., J. Greenwood, G. J. Hunter, R. N. Perham, J. Mol. Biol. 1991, 217, 223.

In addition, specific linkage, binding, and concatenation of virus particles can help produce longer viral scaffolds, and thus longer nanowires. The multiplicity of additions can be controlled by engineering binding motifs into one virus, which then can accurately recognize binding sites on another virus. For example, the pIII protein resides at one end of the M13 virus and can be exploited to display peptide and protein fusions. At the other end of the virus, the pIX and pVII proteins also can be subject to modification. For example, Gao and coworkers utilized pIX and pVII fusions to display antibody heavy- and light-chain variable regions. [See, e.g., C. Gao, S. Mao, G. Kaufmann, P. Wirsching, R. A. Lerner, K. D. Janda, Proc. Natl. Acad. Sci. 2002, 99, 12612] See, also, for example, U.S. Pat. No. 6,472,147 for genetic modification of viruses. These end modifications may be used to link the virus particles directly or the end modifications may specifically bind to a linker. The linker may be any suitable material. For example, the linker can be a nanoparticle, amino acid oligomer, nucleic acid oligomer, or a polymer. This present invention encompasses dual-end viral display, either for generating bimodal heterostructures, or in combination with pVIII, producing end-functionalized nanowires.

In addition, dual-end directional linkages enable creation of other interesting and commercially useful geometries, such as rings, squares and other arrays. The binding of one end of a virus directly to the other end of the virus without the use of a linker can be used to form rings, wires, or other viral based structures as well. By engineering recognition sites and the corresponding conjugate moieties into a single virus, or multiple viruses, the entire system can be genetically programmed.

An important advantage of the invention is that the organic scaffold can be an active scaffold, wherein the scaffold not only serves as a template for synthesis of the inorganic nanowire, but also actively assists in coupling the inorganic nanowire to other structures. For example, an organic scaffold which is designed at one end to bind to another structure can be used to couple the inorganic nanowire to the structure. The scaffolds and the nanowires can be coupled to each other, for example, to form segments of similar or dissimilar materials. In this embodiment, the composition of the nanowire would vary as a function of length.

Additional description is provided for the types of viral structures which can be designed by genetic programming for particular applications based on length control, geometry control, binding control, and the like. The virus scaffold is not particularly limited, and combinations of viruses can be used of different types. In general, viruses can be used which can be multifunctionalized. In general, virus particles which are long, filamentous structures can be used. See, e.g., *Genetically Engineered Viruses*, Christopher Ring (Ed.), Bios Scientific, 2001, pages 11-21. Additionally, other viral geometries such as dodecahedral and icosahedral can be multifunctionalized and used to create composite materials. Virus particles which can function as flexible rods, forming liquid crystalline and otherwise aligned structures, can be used.

In particular, phage display libraries, directed evolution, and biopanning are an important part of genetic programming of viruses, and viruses can be used which have been subjected to biopanning in the viral design so that the virus particles specifically can recognize and bind to materials which were the object of the biopanning. The materials can also be nucleated and synthesized in particulate form, including nanoparticulate form, in the presence of the specific recognition and binding sites. Use of filamentous virus in so called directed evolution or biopanning is further described in the patent literature including, for example, U.S. Pat. Nos. 5,223,409 and 5,571,698 to Ladner et al. ("Directed Evolution of Novel Binding Proteins"). Additional references on the recognition properties of viruses include U.S. Pat. No. 5,403,484 (phage display libraries, now commercially available) and WO 03/078451.

Mixtures of two or more different kinds of viruses can be used. Mixtures of virus particles with non-virus materials can be used in forming materials which use the present invention.

Virus and virus particle can include both an entire virus and portions of a virus including at least the virus capsid. The term virus can refer to both viruses and phages. Entire viruses can include a nucleic acid genome, a capsid, and may optionally include an envelope. Viruses as described in the present invention may further include both native and heterologous amino acid oligomers, such as cell adhesion factors. The nucleic acid genome may be either a native genome or an engineered genome. A virus particle further includes portions of viruses comprising at least the capsid.

In general, a virus particle has a native structure, wherein the peptide and nucleic acid portions of the virus are arranged in particular geometries, which are sought to be preserved when it is incorporated in solid state, self supporting forms such as films and fibers.

Viruses are preferred which have expressed peptides, including peptide oligomers and amino acid oligomer as specific binding sites. Amino acid oligomers can include any sequence of amino acids whether native to a virus or heterologous. Amino acid oligomers may be any length and may include non-amino acid components. Oligomers having about 5 to about 100, and more particularly, about 5 to about 30 amino acid units as specific binding site can be used. Non-amino acid components include, but are not limited to sugars, lipids, or inorganic molecules.

The size and dimensions of the virus particle can be such that the particle is anisotropic and elongated. Generally, the viruses may be characterized by an aspect ratio of at least 25, at least 50, at least 75, at least 100, or even at least 250 or 500 (length to width, e.g, 25:1).

A wide variety of viruses may be used to practice the present invention. The compositions and materials of the invention may comprise a plurality of viruses of a single type or a plurality of different types of viruses. Preferably, the virus particles comprising the present invention are helical viruses. Examples of helical viruses include, but are not limited to, tobacco mosaic virus (TMV), phage pf1, phage fd1, CTX phage, and phage M13. These viruses are generally rod-shaped and may be rigid or flexible. One of skill in the art may select viruses depending on the intended use and properties of the virus.

Preferably, the viruses of the present invention have been engineered to express one or more peptide sequences including amino acid oligomers on the surface of the viruses. The amino acid oligomers may be native to the virus or heterologous sequences derived from other organisms or engineered to meet specific needs.

A number of references teach the engineering of viruses to express amino acid oligomers and may be used to assist in practicing the present invention. For example, U.S. Pat. No. 5,403,484 by Ladner et al discloses the selection and expression of heterologous binding domains on the surface of viruses. U.S. Pat. No. 5,766,905 by Studier et al discloses a display vector comprising DNA encoding at least a portion of capsid protein followed by a cloning site for insertion of a foreign DNA sequence. The compositions described are useful in producing a virus displaying a protein or peptide of interest. U.S. Pat. No. 5,885,808 by Spooner et al discloses an adenovirus and method of modifying an adenovirus with a modified cell-binding moiety. U.S. Pat. No. 6,261,554 by Valerio et al shows an engineered gene delivery vehicle comprising a gene of interest and a viral capsid or envelope carrying a member of a specific binding pair. U.S. Published Patent Application 2001/0019820 by Li shows viruses engineered to express ligands on their surfaces for the detection of molecules, such as polypeptides, cells, receptors, and channel proteins.

The genetically engineered viruses can be prepared by methods and vectors as described in Kay, B. K.; Winter, J.; McCafferty, J. *Phage Display of Peptides and Proteins: A Laboratory Manual*; Academic Press: San Diego, 1996, and in particular, chapter 3, "Vectors for Phage Display" and references cited therein. In addition, the genetically engineered viruses can be prepared by methods as described in, *Phage Display, A Laboratory Manual*, by Barbas et al. (2001) including Chapter 2, "Phage Display Vectors" and references cited therein. The type of vector is not particularly limited. Table 2.1 of Barbas provides exemplary vectors which can be used in various combinations to provide the multifunctional viruses. For example, type 3, type 8+8, and phagemid type p7/p9 can be combined. Or type 8 and type 3 can be combined along with phagemid p7/p9 as desired. One skilled in the art can develop other combinations based on particular applications. Methods can be developed to either display the peptide on some or substantially all copies of the coat protein.

M13 systems are a preferred example of a filamentous virus scaffold, but other types of filamentous virus scaffolds can be used as well. The wild type filamentous M13 virus is approximately 6.5 nm in diameter and 880 nm in length. The length of the cylinder reflects the length of the packaged single stranded DNA genome size. At one end of M13 virus, there are approximately five molecules each of protein VII (pVII) and protein IX (pIX). The other end has about five molecules each of protein III (pIII) and protein VI (pVI), totaling 10-16 nm in length. The wild type M13 virus coat is composed of roughly 2800 copies of the major coat protein VIII (pVIII) stacked in units of 5 in a helical array.

In sum, evolution of substrate specific peptides through phage display technologies for the directed nucleation of materials on the nanometer scale has been previously reported by papers and patents from Angela Belcher and coworkers (see above description) and serves as the basis for the material specificity in the virus scaffold or template (16) of the present invention. Screening phage libraries for the ability to nucleate and assemble inorganic systems including, for example, the ZnS, CdS (12, 17), FePt and CoPt systems (18) using commercially available bacteriophage libraries expressing either a disulphide constrained heptapeptide or a linear dodecapeptide, has yielded the consensus sequences CNNPMHQNC (termed A7; ZnS), SLTPLTTSHLRS (termed J140; CdS), HNKHLPSTQPLA (termed FP12; FePt), and ACNAGDHANC (termed CP7; CoPt). Incorporation of these peptides into the highly ordered, self assembled capsid of the M13 bacteriophage virus provides a linear template which can simultaneously control particle phase and composition, while maintaining an ease of material adaptability through genetic tuning of the basic protein building blocks. Because the protein sequences responsible for the materials growth are gene linked and contained within the capsid of the virus, exact genetic copies of this scaffold are relatively easily reproduced by infection into a large suspension of bacterial hosts.

To prepare nanowires, an anisotropic scaffold can be used which has the ability to collect nanoparticles being formed around it and locate them on the scaffold for fusion into a nanowire. In this invention, an inorganic nanowire composition can be formed having a scaffold substantially removed from the inorganic nanowire. Non-viral scaffolds can also be used including, for example, a variety of other organic scaffolds including, for example, scaffolds which have peptide or protein recognition units as side groups on an organic backbone. For example, the organic backbone can be a synthetic polymer backbone, which are well known in the art. For example, polymer scaffolds can be used including for example modified polystyrenes of uniform molecular weight distribution which are functionalized with peptide units. Another example is branched polypeptides or nucleic acids which are modified to have recognition sites. Another example is a nanolithographically printed peptide structures such as a line with nanoscale width. In general, DNA, proteins, and polypeptides can be modified with recognition units, including peptide recognition units, to function as the organic scaffold. Suitable recognition units include, but are not limited to, amino acid oligomers, nucleic acid oligomers, polymers, organic molecules (e.g., antibodies, antigens, cell adhesion factors, and trophic factors), and inorganic materials.

In one embodiment, scaffolds and virus particles can be used which are not directly genetically engineered. However, in general, desirable properties can be achieved when the virus is genetically engineered or genetic engineering is used in designing the scaffold.

III. Nanowires

Using methods described in the previous sections, viruses can be genetically engineered so that they function as a scaffold and bind to conjugate moieties in an overall process which ultimately yields a production of inorganic nanowires according to the present invention. For example, a rod-shaped virus can direct the synthesis of nanoparticulates materials along the length of the rod, and these nanoparticulates materials can be fused into nanowires.

In the present invention, the conjugate materials can be inorganic materials which form nanoparticles including inorganic nanocrystals. From these inorganic nanoparticles, inorganic nanowires can be formed consisting essentially of the fused inorganic nanoparticles upon substantial removal of the scaffold. The conjugate materials and the inorganic nanowires can consist essentially of technologically useful materials such as, for example, semiconducting materials, whether doped or undoped; metallic materials; metal oxide materials, and magnetic materials. Various oxide materials including silica and alumina fall within the scope of the invention. Additional materials of interest for nanotechnology commercial applications are further described in, for example: (a) *Understanding Nanotechnology*, Warner Books, 2002, including materials for circuits such as nanowires and nanotubes described in the chapter "The Incredible Shrinking Circuit", pgs. 92-103 by C. Lieber. (b) *Made to Measure, New Materials for the 21st Century*, Philip Ball, Princeton University, (c) *Introduction to Nanotechnology*, C. P. Poole Jr., F. J. Owens, Wiley, 2003. Preferably, for nanowires, the materials prepared on the scaffold conduct electricity as an electrical conductor, are semiconductive (whether inherently or via doping), transmit light, are magnetic, or possess some other technologically useful property. Other properties include ferroelectric, piezoelectric, converse-piezoelectric, and thermoelectric).

Semiconductors are a particularly important type of inorganic nanowire material. The semiconductor material can be, for example, any of the standard types including alloys thereof including IV-IV Group (e.g., Si, Ge, III-V Group binary (e.g., GaN, GaP), III-V Group ternary (e.g., $Ga(As_{1-x}P_x)$), II-VI Group binary (e.g., ZnS, ZnSe, CdS, CdSe, CdTe), IV-VI Group binary (e.g., PbSe), transition metal oxides (e.g., $BiTiO_3$), and combinations thereof.

Magnetic materials can be those known in the art including nanostructured magnetic materials. See, for example, *Introduction to Nanotechnology*, C. P. Poole Jr., F. J. Owens, Wiley, 2003, Chapter 7, pages 165-193 ("Nanostructured Ferromagnetism) and references cited therein (see, e.g., page 193).

In general, although the present invention is not limited by theory, and the mechanism of nanowire formation is not fully understood, the nanowires can be structures wherein the nanoparticles form into nanowires and collapse into a fused structure at the end of the process. The porosity of the nanowire is not particularly limited, but in general, non-porous nanowire materials are preferred, particularly for conductive applications wherein porosity could interfere with desired conductivity.

The nanowire can be crystalline. The nanowire can be a single crystalline domain or can have one or more crystalline domains. In one embodiment, the fused nanoparticles are single crystalline. The crystalline phase can be either the thermodynamically favorable crystalline state or a crystalline state which is not thermodynamically favorable but is locked in by the relative orientation of the crystalline nanoparticles before fusion. The nanoparticles can be oriented in any manner. For example, the crystallographic axis of the nanoparticles can be oriented with respect to the surface of the scaffold. One can vary the thermal treatment in the method of making (see below) to achieve a desired crystalline structure, or to covert polycrystalline structures to single crystalline structures. One can also vary the thermal treatment to remove the organic scaffold. In some cases fusion and organic scaffold removal are achieved at the same temperature, in other cases, fusion can occur before removal.

The length of the nanowire can be, for example, about 250 nm to about 5 microns, or more particularly, about 400 nm to about 1 micron.

The width of the nanowire can be, for example, about 5 nm to about 50 nm, or more particularly, about 10 nm to about 30 nm.

In some embodiments, the length of the nanowire can be, for example, about 250 nm to about 5 microns, and have a width, for example, of about 5 nm to about 50 nm. In other embodiments, the length of the nanowire can be, for example, about 5 nm to about 50 nm, and have a width, for example, of about 10 nm to about 30 nm.

When a plurality of nanowires is present, the lengths and widths can be expressed as average lengths and widths using known statistical methods in materials science. For example, the average length of the nanowire can be, for example, about 250 nm to about 5 microns, or more particularly, about 400 nm to about 1 micron. The average width of the nanowire can be, for example, about 5 nm to about 50 nm, or more particularly, about 10 nm to about 30 nm.

Also, when a plurality of nanowires is present, the nanowires can be substantially monodisperse in length and/or width. The monodispersity can be accomplished, because the nanowires are assembled from scaffolds with uniform length and width. Again, known statistical methods in material science can be used to calculate the polydispersity for length and width. For example, images of the nanowires can be obtained and, for example, 20-50 nanowires can be selected for statistical analysis. The coefficient of variation (CV) can be calculated wherein the standard deviation is divided by the mean. The CV can be, for example, less than about 20%, more preferably, less than about 10%, more preferably, less than about 5%, and more preferably, less than about 3%.

The nanowires can be substantially straight. For example, straightness can be estimated by (1) measuring the true length of the nanowire, (2) measuring the actual end to end length, (3) calculate the ratio of true length to actual end to end length. For a perfectly straight nanowire, this ratio will be one. In the invention, ratios close to one can be achieved including, for example, less than 1.5, less than 1.2, and less than 1.1.

The inorganic nanowires of the present invention can also be formed in combination with other types of conjugate materials to form larger structures using, for example, multifunctional scaffolds. Hence, the conjugate material is not particularly limited to inorganic materials for these larger structures and combinations of materials can be used. In general, it will be selected for a particular application. It can be selected so that the virus particles can be subjected to biopanning against the conjugate material, and then the conjugate material is selectively or specifically bound to the virus particle. In some applications, selective binding can be sufficient, whereas in other applications, a more powerful specific binding can be preferred. Examples of general types of conjugate materials which can be used in larger structures include inorganic, organic, particulate, nanoparticulate, single crystalline, polycrystalline, amorphous, metallic, magnetic, semiconductor, polymeric, electronically conducting, optically active, conducting polymeric, light-emitting, and fluorescent materials. Conjugate materials are described further, for example, in the patent publications and technical literature to Angela Belcher and co-workers cited throughout this specification.

In sum, the present invention relates to the general, universal synthesis of 1-D nanostructures, including nanowires, based on, in preferred embodiments, a genetically modified virus scaffold for the directed growth and assembly of crystalline nanoparticles into 1-D arrays, followed by annealing of the virus-particle assemblies into high aspect ratio, crystalline nanowires through oriented, aggregation-based crystal growth (14, 15) (FIG. 2A). The synthesis of analogous nanowire structures from fundamentally different materials, e.g., the II-VI semiconductors ZnS and CdS and the $L1_0$ ferromagnetic alloys CoPt and FePt, demonstrates both the generality of the virus scaffold and the ability to precisely control material characteristics through genetic modification. In contrast to other synthetic methods (6), this approach allows for the genetic control of crystalline semiconducting, metallic, oxide, and magnetic materials with a universal scaffold template.

IV. Method of Making Inorganic Nanowires

The present invention also provides methods of making the inorganic nanowires, which are further exemplified in the below working examples. For example, the invention provides a method of forming an inorganic nanowire comprising the steps of: (1) providing one or more precursor materials for the inorganic nanowire; (2) providing an elongated organic scaffold; (3) reacting the one or more precursor materials in the presence of the scaffold to form nanoparticles, wherein the nanoparticles are disposed along the length of the elongated organic scaffold; and (4) thermally treating the scaffold and the nanoparticles to form the inorganic nanowire by fusion of the nanoparticles. In some embodiments, the thermal treatment is not performed, and the method comprises the steps listed as (1)-(3) above. This method of forming a nanowire can also be used to form a plurality of nanowires.

In these methods, the inorganic nanowires are described in the previous section including the crystallinity, types of materials, size including length and width, monodispersity, and straightness. Also, in these methods, the elongated organic scaffold is described above including the viral system with its potential for selective recognition. These methods include situations involving the substantial removal of the organic scaffold.

The invention is not particularly limited by the type of reaction and the precursor materials used to form the nanowire. In general, the reaction and the precursor materials should be compatible with the scaffold. Reactions at temperatures of below 100° C. can be used to form the nanoparticles. In a preferred embodiment, the treating step comprises a chemical reduction of metal precursor salts. Precursor material can be preformed nanoparticles or materials that form nanoparticles, for example.

In a preferred embodiment, the nanoparticles can have an average diameter of about 2 nm to about 10 nm, and more particularly, about 3 nm to about 5 nm. The nanoparticles can be crystalline before and/or after the thermal treating. The nanoparticles can be fused before and/or after thermal treatment. For example, the thermal treatment may act to fuse the nanoparticles, which were not fused prior to the thermal treatment. The nanoparticles can be oriented or not oriented.

The temperature and time of the thermal treatment step are not particularly limited but can vary depending on the precursor materials used and the material of the final nanowire. For example, the melting temperatures and annealing behavior of the materials can be considered in selecting temperature. In general, temperatures of about 100° C. to about 1,000° C. can be used. Thermal treatment can be used to fuse the nanoparticles into a single structure and also to remove the scaffold, tailored for a particular application with particular materials. In principle, the porosity of the nanowire and the degree of fusion of the nanoparticles can be affected by the temperature. In a preferred embodiment, the thermal treatment step can be carried out at about 300° C. or higher, up to about 500° C. In general, and depending on the materials, lower temperatures can be used such as, for example, about 200° C. to about 300° C. if more porous nanowires are desired with less fusion. The thermal treatment step can be carried out at a temperature below the melting temperature of the precursor material. The temperature can be selected to achieve a desired crystalline phase which may be a low energy phase or a high energy phase. If desired, a temperature programming step can be used to tailor the fusion of the nanoparticles, the targeted crystal phase, and the removal of the scaffold, if desired. Higher temperatures of, for example, about 500° C. to about 1,000° C. can be used to ensure the scaffold is completely removed and burned off. Lower temperatures, for example, about 50° C. to 300° C., can be used to avoid removing the scaffold. However, temperature and time can be selected so as to not result in excessive oxidation of the nanowires. The time of the thermal treatment is not particularly limited but can be, for example, 30 minutes to 12 hours. Preferably, the temperature and time for thermal treatment can be adjusted to achieve the optimum balance for nanoparticle fusion while reducing oxide formation and improving the stability of the crystal structure.

In one embodiment, the invention provides a process for producing nanowires with use of an elongated organic scaffold comprising the steps of: (1) providing an elongated organic scaffold which comprises a plurality of binding sites including binding sites along the length of the scaffold and binding sites on at least one end of the scaffold; (2) disposing a nanowire precursor composition along the length of the scaffold to form a scaffolded precursor composition; and (3) treating the scaffolded precursor composition to form the nanowire. In one embodiment, the elongated organic scaffold has binding sites at both ends of the scaffold. In another embodiment, the process further comprises the step of using the binding site at the end of the scaffold to bind to another structure. The other structure can be, for example, another elongated organic scaffold. an electrode, a circuit element, a semiconductor material, an electrically conductive material, a magnetic material, or a biological molecule. The scaffold can be bound to a patterned structure, such as a circuit substrate. The treating step may be a thermal treatment step as described in detail herein. The scaffold can be removed or left intact.

V. Applications

The nanowires of the present invention can be used in many different commercial applications, some of which are noted above, including the cited patent applications, and in the cited references at the end of the specification. The nanowires can be used, for example, in applications requiring electrical conductivity or semiconductivity at the nanoscale. The large surface area to volume ratio of nanowires is advantageous for applications, such as, fule cells, thin film batteries, and supercapacitors. In some applications, a single nanowire can be used. In other applications, a plurality of nanowires can be used, whether in a parallel or crossed manner. In general, organized arrangements of nanowires are advantageous. In some applications, the nanowire can be surface modified, doped, or otherwise modified in its material structure for the application. Modifications include both chemical and biological modifications. Microcircuitry, nanocircuitry, macroelectronics, photovoltaics, solar cells, chemical and biological sensors, optical components, field emitting tips and devices, nanocomputing, nanoswitches, molecular wire crossbars, batteries, fuel cells, catalysts, very large flat panel displays, tiny radio frequency identification devices, smart cards, phased array RF antennas, disposable computing and storage electronics, nanoscale bar codes, cross bar nanostructures, biosensor arrays, high density data storage, field effect transistors, and the like are representative examples of applications for the nanowires. Particularly important semiconductive elements include, for example, p-n diodes, p-i-n diodes, LEDs, and bipolar transistors. Nanowires can be incorporated into a number of devices, such as electronic, optoelectronic, electrochemical, and electromechanical devices. A single nanowire can connect elements in a device or a series of connected segments of nanowires can connect elements. For example, a field effect transistor device may comprise nanowires in both a parallel and crossed arrangement.

Applications of nanowires are described in, for example, U.S. patent application publication no. 2003/0089899 (published May 15, 2003) to Lieber et al. and include, for example, field effect transistors, sensors, and logic gates, and this publication is hereby incorporated by reference in its entirety including its description of devices made from nanowires. Additional applications of nanowires are described in, for example, U.S. patent application publication no. 2003/0200521 (published Oct. 23, 2003) to Lieber et al. and include nanoscale crosspoints, which is incorporated by reference in its entirety. Additional applications of nanowires are described in, for example, U.S. patent application publication no. 2002/0130353 (published Sep. 19, 2002) to Lieber et al. and include devices with chemical patterning and bistable devices. Additional applications of nanowires are described in, for example, U.S. patent application publication no. 2002/0117659 (published Aug. 29, 2002) to Lieber et al. and include nanosensors for chemical and biological detection. In addition, applications for related nanorods are described in, for example, U.S. Pat. Nos. 6,190,634; 6,159,742; 6,036,774; 5,997,832; and 5,897,945 to Lieber et al. A number of literature references teach applications of nanowires and related technology, such as Choi et al., *J. Power Sources* 124:420 (2003); Cui et al., *Science* 293:1289-1292 (2001); De Heer et al., *Science* 270:1179-1180 (1995); and Dominko et al., *Advanced Materials* 14(21):1531-1534 (2002), which all of which are herein incorporated by reference in their entirety.

Of particular importance for this invention, the scaffold can be used to direct the nanowire to other structures so the scaffold is an active scaffold rather than a passive scaffold. For example, viruses can be conjugated with one-dimensional nanowires/nanotubes, two dimensional nano electrodes, and microscale bulk devices. One-dimensional materials, such as nanotubes or nanowires, when conjugated with the pIII end of M13 viruses, may form phase separated lamellar structures that have inorganic nanotube or nanowire layers and phage building block layers. Two-dimensional nano-thick plate shaped electrodes can be organized. Viral-semiconductor composite nanowires can be attached across metal electrodes, including noble metal electrodes such as gold electrodes, through binding sites at either end of the virus. The nanowire can bridge a source and a drain. The nanowire precursor can be disposed on or adjacent to the electrodes and then the scaffold can be removed so that the nanowire can be intimately in electrical contact with the electrode in a final state. The thermal annealing can be carried out prior to bridging the electrodes with the nanowire or after bridging the nanowire to the electrodes, as long as the nanowire ultimately functions as a bridge. These structures can function as nano-FET devices with enhanced performance due to the c.a. 5 nm diameter of the gate region. Unlike other proposed nano-scale devices, where wire placement must be done stochastically, this approach directs single wires to the correct electrode locations. Alternative cathode and anode structures might be useful for nanosize biofuel cells. When the specific binding M13 virus combined with micro-size objects, periodic organization of these micro-dimensional objects is also possible. The role of the M13 virus will be the specific adhesive unit to self-assemble multiple different objects in periodic patterns. The engineering ability of the M13's various proteins can be a key factor in the development of these viral-inorganic hybrid-based arrays. In addition, fibers or fabric like networks of viruses can be constructed with specifically designed mechanical properties based on the secondary and tertiary structures induced by viral-viral binding. In addition these materials can have special properties impregnated into them by further functionalizing the viruses to bind regents or signaling elements.

Additionally, multifunctional viral based arrays can have uses in tissue repair where one part of the array selectively binds to a tissue type where another part can nucleate bone or other structural bio-materials. Additionally, catalytic nanostructures can be developed by controlling elemental identity and geometrical arrangement of molecular catalytic moieties.

The exploitation of the self-assembly motifs employed by the M13 bacteriophage to produce a biological scaffold provides methods of generating a complex, highly ordered, and economical template for the general synthesis of single crystal nanowires. By introducing programmable genetic control over the composition, phase and assembly of nanoparticles, a generic template for the universal synthesis of a variety of materials can be realized. Further advances in the fabrication of nanoscale materials and devices can be achieved through modification of the remaining four proteins in the virus to incorporate device-assembly directors. The ability of viruses to form liquid crystal and otherwise aligned and ordered systems, based on their shape anisotropy, is another promising route for the assembly of virus-based nanowires into well ordered arrays on multiple length scales (11). Overall, modification of biological systems by the introduction of substrate specific peptides presents a method of achieving well ordered nanomaterials in a cost-effective and scalable manner.

In particular, when amino acid oligomers are expressed on a surface, the expression of the amino acid oligomers may serve a number of commercially useful functions, including but not limited to, cell adhesion factors, trophic factors, or binding sites for organic or inorganic molecules. Expression of amino acid oligomers allows the viruses to be engineered to specific applications. For example, the films or fibers comprising engineered fibers may contain amino acid oligomers that initiate or enhance cell growth for use in tissue engineering applications. In another example, amino acid oligomers with specificity for a specific inorganic molecule may be expressed to bind the inorganic molecule to increase the efficiency of a chemical reaction. In still another example, the expressed amino acid oligomer may bind an organic molecule, such as a biodefense agent. Such films or fibers could be incorporated into the clothing of military personnel or first responders as part of a sensor system.

These are only a few examples of the utility of films and fibers made from engineered viruses, and other applications are readily apparent to one of skill in the art.

Working Examples

Figure 2:
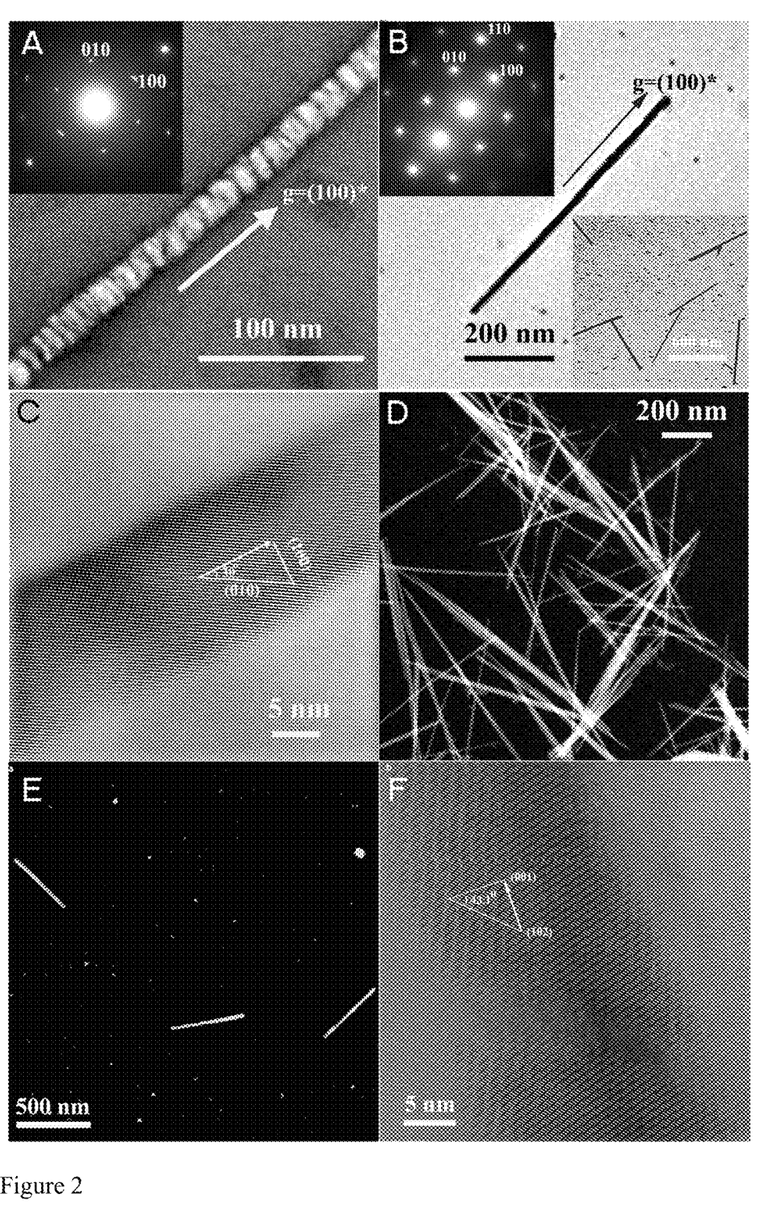
FIGS. 2A-F provide characterization of nanowires made of semiconductor material.
Figure 3:
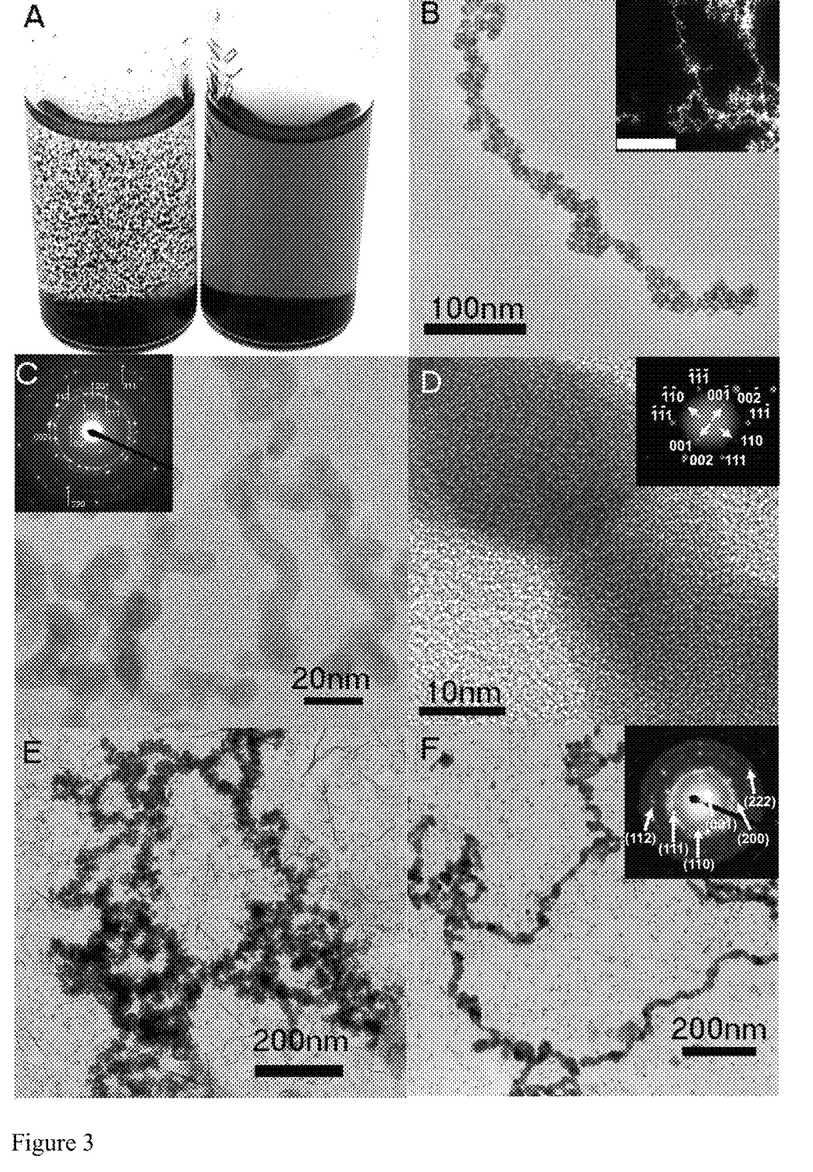
FIGS. 3A-F provide characterization of nanowires made of magnetic material.

The present invention is further characterized by the following non-limiting working examples including FIGS. 2 and 3 and description and discussion thereof. One skilled in the art can use as guidance FIGS. 1-3 in the practice of the present invention which provide an introduction to the working examples.

FIG. 1

FIG. 1A illustrates the nanowire synthesis scheme or the nucleation, ordering and annealing of virus-particle assemblies. FIG. 1B shows the symmetry of the virus. The symmetry allows for ordering of the nucleated particles along the x, y, and z directions fulfilling requirements for aggregation based annealing. FIG. 1C shows the highly ordered nature of the M13 bacteriophage. The highly ordered nature of the self assembled M13 bacteriophage promotes the preferred orientation seen in nucleated particles through the rigidity and packing of the expressed peptides, which is visualized at 20% incorporation. FIG. 1D shows the construct of the M13 bacteriophage virus. The construct has genetically modifiable capsid and ends, specifically the gPVIII, gPIII, and gPIX, which are coded for in the phagemid DNA enclosed within the virus capsid.

FIG. 2

FIGS. 2A-F shows electron microscopy of both the pre- and post-annealed ZnS and CdS viral nanowires. FIG. 2A shows Dark-field Diffraction-contrast imaging of the pre-annealed ZnS system using the (100) reflection reveals the crystallographic ordering of the nucleated nanocrystals, where contrast stems from satisfying the (100) Bragg diffraction condition. The inset of FIG. 2A shows the ED pattern of the polycrystalline pre-annealed wire showing the wurtzite crystal structure and the single crystal type [001] zone axis pattern, suggesting a strong zone axis preferred orientation of the nanocrystals on the viral template. The electron diffraction (ED) pattern (inset of FIG. 2A) shows single crystal-type behavior, even though the sample area is composed of many nanocrystals. This behavior suggests that the nanocrystals on the virus were preferentially oriented with their c-axes perpendicular to the viral surface. FIG. 2B is a Bright-field TEM image of an individual ZnS single crystal nanowire formed after annealing. The upper left inset of FIG. 2B shows the ED pattern along the [001] zone axis shows a single crystal wurtzite structure of the annealed ZnS nanowire. The lower right inset of FIG. 2B is a low magnification TEM image showing the monodisperse, isolated single crystal nanowires. FIG. 2C shows a typical HRTEM of a ZnS single crystal nanowire showing a lattice image that continually extends the length of the wire, confirming the single crystal nature of the annealed nanowire. The measured lattice spacing of 0.33 nm corresponds to the (010) planes in wurtzite ZnS crystals. A 30° orientation of (010) lattice planes with respect to the nanowire axis is consistent with the (100) growth direction determined by ED. FIG. 2D HAADF-STEM image of single crystal ZnS nanowires, which were annealed on a silicon wafer. FIG. 2E shows HAADF STEM images of CdS single crystal nanowires. FIG. 2F is an HRTEM lattice image of an individual CdS nanowire. The experimental lattice fringe spacing, 0.24 nm, is consistent with the unique 0.24519 nm separation between two (102) planes in bulk wurtzite CdS crystals.

FIG. 3

FIG. 3A shows CoPt wires as synthesized by the modified virus template where soluble in water. Reduction of Co and Pt salts without the presence of the virus yielded large precipitates which immediately fell out of solution. FIG. 3B shows a TEM image of the unannealed CoPt system. The inset of FIG. 3B shows a STEM image of unannealed CoPt wires. The scale bar shown is 100 nm. FIG. 3C shows a low resolution TEM image of crystalline $L1_0$ CoPt wires (about 650 nm×about 20 nm). The tendency of the CoPt and FePt wires to not be straight may stem from magnetic interactions between wires and/or nanoparticles not present in the II-VI systems. The inset of FIG. 3C is an ED showing the characteristic (110) and (001), L10 lines, and the crystallinity of the system. FIG. 3D is an HRTEM of the CoPt wires with the (111) plane perpendicular to the c-axis of the wire. The inset ED reveals the superlattice structure unique to the L10 phase. FIG. 3E is a TEM imaging of the unannealed FePt wires. FIG. 3F shows a TEM of the annealed FePt wires. The inset ED pattern confirms the L10 nature of the FePt wires and shows the crystalline nature of the material.

Engineering M13 Bacteriophage

The M13 bacteriophage used in the working examples is a high production rate virus (200 mg/L) comprised of five genetically modifiable proteins (19, 20, 21); gene products (gP)-3, 6, 7, 8 and 9, of which ~2700 copies of the gP8 protein forms the capsid of the wild type virus. The gP8 protein was genetically modified and expressed using a phagemid system, resulting in fusion of the substrate specific peptides to the N-terminus of the gP8 protein (12). During assembly, stacking of the gP8 unit cell results in a five-fold symmetry down the length (c-axis) of the virus and is the origin of the ordering of fusion peptides in a three-dimensional structure (FIG. 1B). Computational analysis of peptide expression on the capsid of the virus revealed that the nearest neighbor peptide separation stabilized around 3 nm at and above 20% incorporation (FIG. 1C). Consequently, high incorporation of the substrate specific fusion peptides is not required for complete mineralization of the virus to occur. Tri-functional templates can be realized through further genetic modification of the proximal and remote tips of the virus (specifically the gP3 and gP9 proteins, 22) which can be used to push the current system to higher aspect ratios and introduce materials including materials such as, for example, noble metals, semiconductors, and oxides to assemble functional heterostructured materials (FIG. 1D).

Mineralization of Scaffolds

Mineralization of the ZnS and CdS systems have been described previously (11, 12; 17) and involves incubation of the viral template with metal salt precursors at reduced temperatures to promote uniform orientation of the nanocrystals during nucleation (23), leading to the preferred crystallographic orientation of nucleated nanocrystals with respect to the long axis of the virus. Prior to annealing, wurtzite ZnS and CdS nanocrystals (3-5 nm) grown on the virus surface were in close contact and preferentially oriented with the [001] direction and the (100) plane perpendicular to the wire length direction, which is supported by Electron Diffraction (ED), High Resolution Transmission Electron Microscopy (HR-TEM), High Angle Annular Dark Field Scanning Transmission Electron Microscopy (HAADF-STEM), and Dark-field Diffraction-contrast Imaging (FIG. 2) (24). Particles attached to the virus were likely prohibited from fusing under initial synthesis conditions likely due for example to the blocking effects of the neighboring peptides, and therefore removal of the template was desired in order to form single crystal nanowires. Thermal analysis of the virus-particle system showed complete removal of the organic materials by 350° C. (25), which corresponded to the minimum temperature observed for the fusion of adjacent particles by TEM with annealing performed in situ using a thermal stage (26).

Formation of Nanowires

Annealing of the mineralized viruses at temperatures below the ZnS and CdS particle melting point (400-500° C.) allowed the polycrystalline assemblies to form single crystal nanowires (for ZnS nanowires, length distribution was about 600-650 nm; for CdS nanowires, length distribution was about 475-500 nm; the diameters for ZnS and CdS nanowires were about 20 nm) through removal of the organic template and minimization of the interfacial energy (27) (FIG. 2B, E). ED and HRTEM revealed the single crystal nature of individual nanowires that inherited the preferred orientation seen in the precursor polycrystalline wires through removal of the grain boundaries (28, 29) (FIGS. 2C and D). The [100] direction and (001) plane orientations of the observed ZnS nanowires where consistent with common elongation directions for II-VI nanowires, even though these are thermodynamically high energy planes (FIGS. 2B and C; 14, 30, 31). HRTEM of the single crystal CdS nanowires revealed a lattice spacing of 2.4 Å that was consistent with the unique 2.4519 Å separation between two (102) planes in bulk wurtzite CdS crystals (JCPDS #41-1049). The 43.1° orientation of (102) lattice planes with respect to the nanowire axis indicated that the nanowire was elongated along the [001] direction and again confirmed the wurtzite structure (FIG. 2F).

Formation of Ferromagnetic Nanowires

Extending the virus-directed synthesis approach to the ferromagnetic $L1_0$ CoPt and FePt systems was carried out for demonstrating both the diversity of applicable materials and to address current technological issues regarding the development of low-dimensional magnetic materials. Platinum alloyed magnetic materials of the chemically ordered $L1_0$ phase have been of recent interest due to their high coercivity, resistance to oxidation, and inherent magnetic anisotropy important for ultrahigh density recording media (32). Although synthetic routes such as VLS yield exquisite 1-D semiconducting structures and non-specific template schemes are applicable to a range of materials, both have faced difficulties in producing high-quality, crystalline metallic and magnetic nanowires in free standing form (33).

Genetically Engineered Scaffolds

The M13 bacteriophage was modified by fusing either the CP7 CoPt specific or FP12 FePt specific peptide into the virus capsid. Nucleation of the CoPt and FePt particles was achieved via the chemical reduction of metal precursor salts in the presence of gP8 modified viruses (18, 34). Annealing of the assemblies at 350° C. promoted the growth of crystalline CoPt and FePt nanowires of the $L1_0$ phase that were uniform in diameter (10 nm+/−5%). The crystalline nature of the wires can be seen in the selected area ED pattern, which also shows the characteristic (001) and (110) $L1_0$ peaks, and by high resolution TEM lattice imaging (FIG. 3C, D). The (111) plane perpendicular to the long axis of the CoPt wires with a lattice spacing of 2.177 Å was in agreement with the reported value of 2.176 Å, and again confirmed the highly crystalline nature of the material (FIG. 3D, JCPDS #43-1358). The persistence of the $L1_0$ phase, which is kinetically accessible above 550° C. (15), was attributed to the propensity of particles to maintain their orientation during aggregation-based annealing.

Nanowire Design Simulations

The invention including the working examples can be further understood with use of simulation methods. For example, Monte Carlo simulations of the A7 constrained sequence resulted in a 21% decrease in the standard deviation of backbone dihedral angles upon transfer of the peptide from isolation into the capsid environment, demonstrating the rigidity imposed on the fusion peptide (35). Ordering of the nucleated particles with regards to preferred crystallographic orientation along the length of the virus was believed to be a result of the stability of the peptide fusion and the symmetry of the virus coat. This nanocrystal ordering promoted the single crystal nature of the annealed nanowires by satisfying the orientation requirements of the aggregation-based crystal growth mechanism (14). Although particles exhibiting orientations not coherent with that of the majority were to be expected, these minority nanocrystals should rotate to adopt the preferred crystallographic orientation and merge with the majority to minimize both the interfacial and grain boundary energies (31, 36, 37).

Additional experimental details can be found in several of the below footnotes.

Although making and using various embodiments of the present invention are discussed in herein, it will be appreciated that the present invention provides many applicable inventive concepts that can be embodied in a wide variety of specific contexts. The specific embodiments discussed herein are merely illustrative of specific ways to make and use the invention, and do not delimit the scope of the invention.

The following references are not admitted prior art but can be used to guide one skilled in the art in the practice of the present invention, and also are incorporated herein by reference in their entirety.

1. R. de Picciotto, H. L. Stormer, L. N. Pfeiffer, K. W. Baldwin, K. W. West, *Nature* 411, 51 (2001).
2. Y. Wang, L. Zhang, C. Liang, G. Wang, X. Peng, *Chem. Phys. Lett.* 357, 314 (2002).
3. Y. Huang et. al., *Science* 294, 1313 (2001).
4. A. M. Morales, C. M. Lieber, *Science* 279, 208 (1998).
5. L. Manna, E. C. Scher, A. P. Alivisatos, *J. Am. Chem. Soc.* 122, 12700 (2000).
6. Y. Xia et. al., *Adv. Mat.* 15, 353 (2003).
7. J. N. Cha, G. D. Stucky, D. E. Morse, T. J. Deming, *Nature* 403, 289 (2000).
8. J. D. Hartgerink, E. Beniash, S. I, Stupp, *Science* 294, 1684 (2001).
9. T. Douglas, M. Young, *Nature* 393, 152 (1998).
10. E. Dujardin et. al., *Nano Lett.* 3, 413 (2003).
11. S. Lee, C. Mao, C. E. Flynn, A. M. Belcher, *Science* 296, 892 (2002).
12. C. Mao et. al., *Proc. Natl. Acad. Sci. USA* 100, 6946 (2003) including supporting text information published separately on the PNAS web site, www.pnas.org.
13. M. Reches, E. Gazit, *Science* 300, 625 (2003).
14. J. F. Banfield et. al., *Science* 289, 751 (2000).
15. K. Barmak et. al., *Appl. Phys. Lett.* 80, 4268 (2002).
16. S. R. Whaley, D. S. English, E. L. Hu, P. F. Barbara, A. M. Belcher, *Nature* 405, 665 (2000).
17. C. Flynn, et. al., *J. Mat. Chem.* 13, 2414 (2003).
18. Reiss, B. D., Mao, C., Solis, D. J., Ryan, K. S., Thomson, T. and Belcher, A. M. (2004) *NanoLetters* 4(6):1127-1132. Describes a new synthetic strategy which utilizes selected peptides as a biological template for the room temperature synthesis of the L10 phase of FePt and CoPt and HCP SmCo5 ferromagnetic nanoparticles. The approach uses an aqueous, room temperature approach.
19. C. F. Barbas III et. al., Phage Display, *A Laboratory Manual*, (CSHL Press, New York, 2001).
20. C. Gao et. al., *Proc. Natl. Acad. Sci. USA* 96, 6025 (1999).
21. P. Malik, R. N. Perham, *Nucl. Acids Research* 25, 915 (1997).
22. K. Nam, et. al., *Nano Lett.* (2003).
23. W. D. Luedtke, U. Landman, *J. Phys. Chem.* 100, 13323 (1996).
24. Annealing of the ZnS mineralized viruses on aminosilanized SiO2 wafers at 400-500° C., depending on particle size distribution, for 3 hours was followed by sonication in 1:1 water and ethanol. The suspension of annealed wires was drop coated onto TEM grids for visualization. Increasing the wetability of the substrates was important for the alignment of the virus assemblies.

25. Thermal Gravimetric Analysis was performed on the Perkin Elmer 200 TGA/DTA, with flow gasses consisting of air, argon, and forming gas (5% $H_2$). Samples where prepared by centrifugation of the virus-particle suspension into 1 mg pellets and allowed to dry.

26. TEM samples where analyzed using the JEOL 2010 and 2010-FEG microscopes. HAADF analysis of the ZnS and CdS samples where performed on the JEOL 2010-FEG. in situ thermal analysis of the CoPt system was performed on the JEOL 200CX microscope using a Gatan heat stage.

27. S. B. Qadri et. Al., *Phys. Rev. B* 60, 9191 (1999).

28. X. Duang, C. M. Lieber, *Adv. Mat.* 12, 298 (2000).

29. C. Ye, G. Meng, Y. Wang, Z. Jiang, L. Zhang, *J. Phys. Chem. B* (2000).

30. A. P. Alivisatos, *Science* 289, 736 (2000).

31. R. L. Penn, J. F. Banfield, *Geochimica et Cosmochimica Acta.*, 63, 1549 (1999).

32. S. Sun, C. B. Murray, D. Weller, L. Folks, A. Moser, *Science* 287, 1989 (2000).

33. Y. H. Huang, H. Okumura, G. C. Hadjipanayis, D. Weller, *J. Appl. Phys.* 91, 6869 (2002).

34. CoPt wires where synthesized by the interaction of 1 mL of CoPt specific viruses ($10^{12}$ phage/mL) with 0.5 mM $CoCl_2$ and 0.5 mM $H_2PtCl_6$ in a 1:1 ratio. In the case of FePt 1 ml of phage ($10^{12}$ phage/ml) was mixed with 0.01 mM $FeCl_2$ and 0.01 mM $H_2PtCl_6$. These mixtures where vortexed for ten minutes to ensure mixing, and 0.1 M $NaBH_4$ was added to reduce the metals forming the desired nanoparticles. The CoPt and FePt systems where applied directly to SiO TEM grids and annealed under forming gas (5% $H_2$) to prevent the onset of oxidation for 3 hours at 350° C.

35. The virus assembly was reconstructed from the gP8 protein structure obtained from the Protein Data Bank (#1ifj) by application of the appropriate translation vectors. A random number generator was utilized to realistically incorporate peptide inserts in the gP8 assembly at a given incorporation percentage. The peptide inserts were modeled in the capsid environment using Monte Carlo software MCPRO (Jorgensen, W. L., MCPRO, Version 1.68, Yale University, New Haven, Conn., 2002.) with solvent effects accounted for by the Poisson-Boltzmann toolkit ZAP (OpenEye Scientific Software.)

36. H. Zhu, R. S. Averback, *Philo. Mag. Lett.* 73, 27 (1996).

37. M. Yeadon, M. Ghaly, J. C. Yang, R. S. Averback, J. M. Gibson, *Appl. Phys. Lett.* 73, 3208 (1998).

38. An, K. H., Kim, W. S., Park, Y. S., Choi, Y. C., Lee, S. M., Chung, D. C., Bae, D. J., Lim, S. C. and Lee, Y. H. (2001) Supercapacitors using single-walled carbon nanotube electrodes. *Advanced Materials* 13(7):497-500.

39. Bonard, J.-M., Klinke, C., Dean, K. A. and Coll, B. F. (2003) Degradation and failure of carbon nanotube field emitters. *Physical Review B: Condensed Matter and Materials Physics* 67(11): 115406-115406.

40. Chang, K.-W. and Wu, J.-J. (2004) Low-temperature catalytic growth of β-Ga2O3 nanowires using single organometallic precursor. *J. Phys. Chem. B* 108:1838-1843.

41. Flynn, C. E., Lee, S.-W., Peelle, B. R. and Belcher, A. M. (2003) Viruses as vehicles for growth, organization and assembly of materials. *Acta Materialia* 51:5867-5880.

42. Greenwood, J., Hunter, G. J. and Perhan, R. N. (1991) Regulation of filamentous bacteriophage length by modification of electrostatic interactions between coat protein and DNA. *Journal of Molecular Biology* 217:223-227.

43. Gudiksen, M. S., Lauhon, L. J., Wang, J., Smith, D. C. and Lieber, C. M. (2002) Growth of nanowire superlattice structures for nanoscale photonics and electronics. *Nature* 415:617-620.

44. Hu, J., Li, L.-S., Weidong, Y., Manna, L., Wang, L.-W. and Alivasatos, A. P. (2001) Linearly polarized emission from colloidal semiconductor quantum rods. *Science* 292:2060-2063.

45. Keren, K., Berman, R. S., Buchstab, E., Sivan, U. and Braun, E. (2003) DNA-templated carbon nanotube field-effect transistor. *Science* 302:1380-1382.

46. Kuykendall, T., Pauzauskie, P., Sangkwon, L., Zhang, Y., Goldberger, J. and Peidong, Y. (2003) Metalorganic chemical vapor deposition route to GaN Nanowires with triangular cross sections. *NanoLetters* 3(8):1063-1066.

47. Kuykendall, T., Pauzauskie, P. J., Zhang, Y., Goldberger, J., Sirbuly, D., Denlinger, J. and Yang, P. (2004) Crystallographic alignment of high-density gallium nitride nanowire arrays. *Nature Materials* 3: 524-528.

48. Lewenstein, J. C., Burgin, T. P., Ribayrol, A., Nagahara, L. A. and Tsui, R. K. (2002) High-yield selective placement of carbon nanotubes on pre-patterned electrodes. *NanoLetters* 2(5):443-446.

49. Mao, C., Solis, D. J., Reiss, B. D., Kottmann, S. T., Sweeney, R. Y., Hayhurst, A., Georgiou, G., Iverson, B. and Belcher, A. M. (2004) Virus-based toolkit for the directed synthesis of magnetic and semiconducting nanowires. *Science* 303:213-217.

50. Morales, A. M. and Lieber, C. M. (1998) A laser ablation method for the synthesis of crystalline semiconductor nanowires. *Science* 279:208-211.

51. Murakami, H., Hirakawa, M., Tanaka, C. and Yamakawa, H. (2000) Field emission from well-aligned, patterned, carbon nanotube emitters. *Applied Physics Letters* 76(13): 1776-1778.

52. Nam, K. T., Peelle, B. R., Lee, S.-W. and Belcher, A. M. (2004) Genetically driven assembly of nanorings based on the M13 virus, *NanoLetters* 4(1):23-27.

53. Ng, H. T., Han, J., Yamada, T., Nguyen, P., Chen, Y. P. and Meyyappan, M. (2004) Single crystal nanowire vertical surround-gate field-effect transistor. *NanoLetters* 4(7): 1247-1252.

54. Oh, S. J., Cheng, Y., Zhang, J., Shimoda, H. and Zhou, O. (2003) Room-temperature fabrication of high-resolution carbon nanotube field-emission cathods by self-assembly. *Applied Physics Letters* 82(15):2521-2523.

55. Rao, C. N. R., Kulkarni, G. U., Thomas, P. J., Agrawal, V. V., Gautam, U. K. and Ghosh, M. (2003) Nanocrystals of metals, semiconductors and oxides: Novel synthesis and applications. *Current Science* 85(7):1041-1045.

56. Savchuk, A. I., Stolyarchuk, I. D., Medynskiy, S. V., Fediv, V. I., Kandyba, Y. O., Perrone, A., DeGiorgi, M. L. and Nikitin, P. I. (2001) Technological aspects of fabrication of semimagnetic semiconductor nanocrystals. *Materials Science and Engineering—Amsterdam Then Lausanne—C* 15(1-2):79-82.

57. Spindt, C. A., Brodie, I., Humphrey, L. and Westerberg, E. R. (1976) Physical properties of thin-film field emission cathodes with molybdenum cones. *Journal of Applied Physics* 47(12):5248-63.

58. Tang, X.-P., Kleinhammes, A., Shimoda, H., Fleming, L., Bennoune, K. Y., Sinha, S., Bower, C., Zhou, O. and Wu, Y. (2000) Electronic structures of single-walled carbon nanotubes determined by NMR. *Science* 288:492-494.

59. Williams, K. A., Veenhuizen, P. T. M., de la Tone, B. G., Eritja, R. and Dekker, C. (2002) Carbon nanotubes with DNA recognition. *Nature* 420:761.
60. Fairley, Peter, (2003) Germs That Build Circuits, *IEEE Spectrum* 37-41.

The invention claimed is:

1. An inorganic nanowire composition, comprising a plurality of inorganic nanowires, each inorganic nanowire comprising a plurality of fused inorganic nanoparticles, orientation and position of the fused inorganic nanoparticles being defined by a location of binding of the inorganic nanoparticles to an organic template.

2. The inorganic nanowire composition of claim 1, wherein a length of the inorganic nanowires is defined by a length of an organic template.

3. The inorganic nanowire composition of claim 1, wherein the plurality of inorganic nanoparticles comprises the same composition.

4. The inorganic nanowire composition of claim 1, wherein the plurality of inorganic nanoparticles comprises different compositions.

5. The inorganic nanowire composition of claim 4, wherein the nanowires of different compositions are fused along a length of the nanowire in a periodic pattern.

6. The inorganic nanowire composition of claim 1, wherein the plurality of inorganic nanoparticles comprises one or more of a semiconductor material, a metallic material, a metal oxide material, a magnetic material, or mixtures thereof.

7. The inorganic nanowire composition of claim 1, wherein the plurality of nanowires has a length of from about 250 nm to about 5 microns and a width of from about 5 nm to about 50 nm.

8. The inorganic nanowire composition of claim 1, wherein the plurality of inorganic nanowires comprises a substantially monodisperse average length.

9. The inorganic nanowire composition of claim 1, wherein the inorganic nanowires comprises a substantially monodisperse average width.

* * * * *